(12) United States Patent
Yeh et al.

(10) Patent No.: US 9,006,770 B2
(45) Date of Patent: Apr. 14, 2015

(54) LIGHT EMITTING DIODE CARRIER

(75) Inventors: Wei-Yu Yeh, Tainan (TW); Pei-Wen Ko, Zhubei (TW); Chih-Hsuan Sun, Kaohsiung (TW); Hsueh-Hung Fu, Hsinchu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 16 days.

(21) Appl. No.: 13/110,642

(22) Filed: May 18, 2011

(65) Prior Publication Data

US 2012/0292655 A1  Nov. 22, 2012

(51) Int. Cl.
*H01L 33/00* (2010.01)
*H01L 33/64* (2010.01)
*H05K 1/02* (2006.01)
*H01L 33/62* (2010.01)
*H05K 1/05* (2006.01)

(52) U.S. Cl.
CPC ............ *H01L 33/641* (2013.01); *H05K 1/0203* (2013.01); *H01L 33/62* (2013.01); *H01L 2933/0075* (2013.01); *H05K 2201/10106* (2013.01); *H05K 1/0206* (2013.01); *H05K 1/05* (2013.01); *H05K 2201/10969* (2013.01); *H01L 2924/0002* (2013.01)

(58) Field of Classification Search
USPC .............. 257/79, 99, 678, 734, 661, E33.001, 257/E21.001, E33.075, E33.066; 438/584, 438/20, 22, 100, 141, 455
See application file for complete search history.

(56) References Cited

U.S. PATENT DOCUMENTS

| 4,724,283 | A  | * | 2/1988  | Shimada et al. ............... 174/257 |
| 5,506,446 | A  | * | 4/1996  | Hoffman et al. .............. 257/674 |
| 6,498,355 | B1 | * | 12/2002 | Harrah et al. .................... 257/99 |
| 7,812,363 | B2 | * | 10/2010 | Higashi ........................... 257/98 |
| 2006/0180821 | A1 | * | 8/2006 | Fan et al. ......................... 257/98 |
| 2007/0057364 | A1 | * | 3/2007 | Wang et al. .................... 257/701 |
| 2007/0241363 | A1 | * | 10/2007 | Yen ................................ 257/103 |
| 2008/0291688 | A1 | * | 11/2008 | Higashi .......................... 362/516 |
| 2009/0146295 | A1 | * | 6/2009 | Narita et al. ................... 257/720 |

FOREIGN PATENT DOCUMENTS

CN  1816918 A  8/2006
WO  WO 2010/032169 A1  3/2010

\* cited by examiner

*Primary Examiner* — Lex Malsawma
*Assistant Examiner* — Laura Dykes
(74) *Attorney, Agent, or Firm* — Haynes and Boone, LLP

(57) ABSTRACT

A light emitting diode (LED) carrier assembly includes an LED die mounted on a silicon submount, a middle layer that is thermally conductive and electrically isolating disposed below the silicon submount, and a printed circuit board (PCB) disposed below the middle layer. The middle layer is bonded with the silicon submount and the PCB.

16 Claims, 3 Drawing Sheets

LIGHT EMITTING DIODE CARRIER

TECHNICAL FIELD

The present disclosure relates generally to an integrated circuit and, more particularly, to a light emitting diode (LED) carrier.

BACKGROUND

High-power LEDs, e.g., using as much as 10 W and beyond in a single package, have become more widely used, and LEDs with even more power are expected in the future. Some of the electricity in the LED is converted into heat instead of light, and if the heat is not removed, the LEDs run at high temperatures. This lowers the LED's efficiency. Thus, thermal management of high power LEDs is an important issue. In some LEDs, Aluminium Nitride (AlN) is used on LED carrier because AN is a material with high thermal conductivity (>150 W/mK) and good electrical isolation (>10 kV/mm). But AlN is expensive and difficult for assembly because of brittle characteristics of the material.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
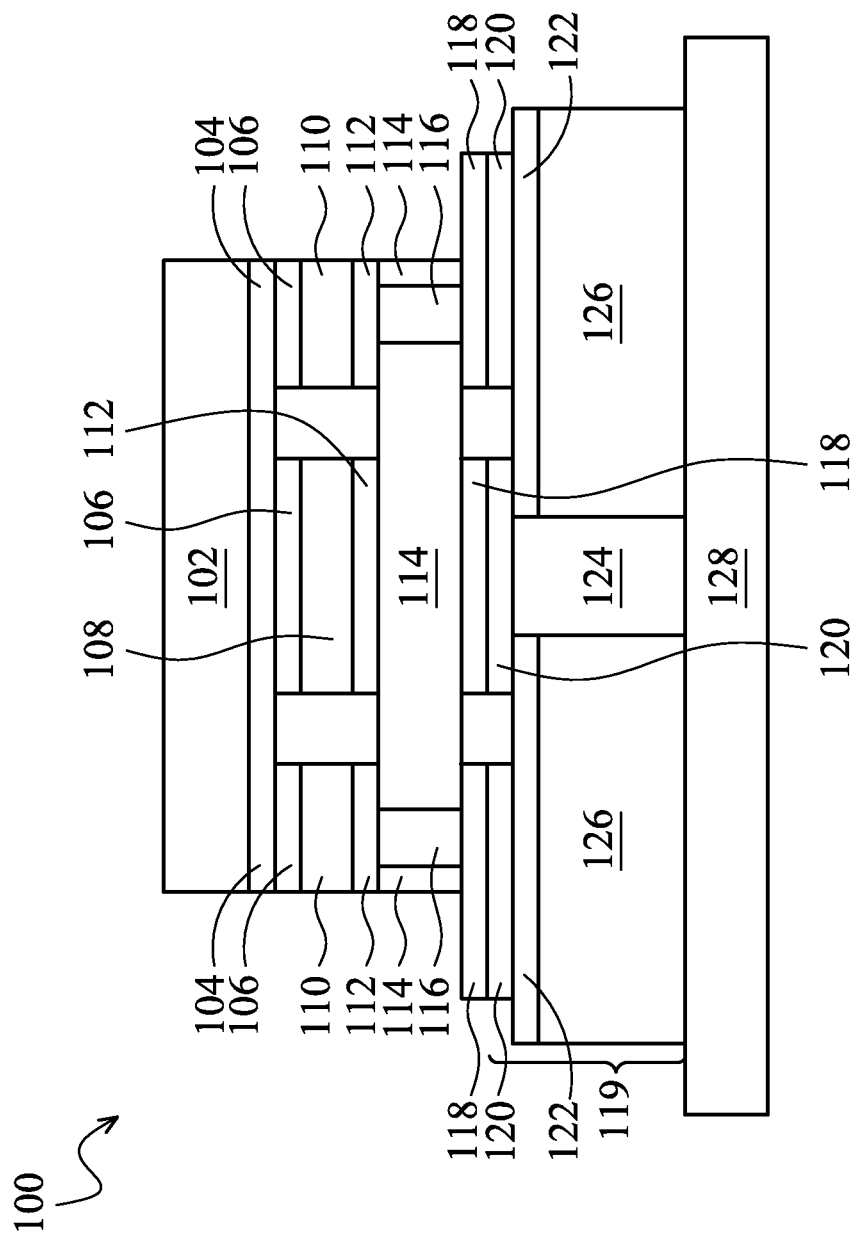
FIG. 1 is a schematic diagram showing an exemplary light emitting diode (LED) carrier assembly according to some embodiments.

FIG. 1 is a schematic diagram showing an exemplary light emitting diode (LED) carrier assembly according to some embodiments. The LED carrier assembly 100 shows an LED die 102 mounted on a silicon submount 104. The LED die 102 can be any color LED comprising different materials. For example, the LED die 102 may include GaN for Blue/Green color, AlInGaP for Yellow/Red, etc. The LED die 102 may have different sizes (e.g., a dimension of about 4×4 mm$^2$, could be larger or smaller) with different thicknesses (e.g., about 100 μm, could be thicker or thinner).

The silicon submount 104 could integrate an LED process for the LED die 102 with a complex silicon circuit. It's relatively easy to make circuits on the silicon submount 104 using a matured semiconductor technology. A complex integrated circuit with LED or other detector circuit can be fabricated based on silicon process. The silicon submount 104 can have different thicknesses, e.g., about 400 μm (could be thicker or thinner).

A eutectic bonding or a soldering layer 106 bonds the silicon submount 104 to a thermal pad 108 and electrical pads 110. The eutectic bonding or a soldering layer 106 can be, for example, Ni/Au, or AuSn alloy with a thickness of about 2 μm. In other embodiments, direct bonding or other bonding techniques can be used. There are many bonding processes and specifications, which are known in the art. A thermal pad 108 can comprise a Cu/Ni/Au alloy with a thickness of about 10 μm-about 14 μm, which is used to for efficient thermal conduction from the LED die 102 to the layers below. An electrical pad 110 can comprise a Cu/Ni/Au alloy with a thickness of about 10 μpm-about 14 μm, which is used for electrical connection of the LED die 102, e.g., for a cathode or an anode. A copper clad layer 112 can comprise Cu with a thickness of about 35 μm-about 200 μm.

A middle layer 114 is thermally conductive (e.g., >20 W/mK) and electrically isolating (e.g., >10 kV/mm). In order to efficiently manage the thermal characteristics (i.e., heat) of the LED die 102 based on the silicon submount 104 with high power/heat density, it is necessary to put the LED die 102 on a carrier with good thermal management and electrical isolation characteristics. Various materials, such as AN, $Al_2O_3$, diamond, any combination thereof, or any other suitable material can be used with a thickness of about 1 mm-about 2 mm.

Vias (or through holes) 116 are used for electrical connection through the middle layer 114. The vias 116 can include Cu, Au, Ag, or any other suitable material (filled). Another eutectic bonding or soldering layer 118 bonds the middle layer 114 (and the vias 116) and another copper clad layer 120. The eutectic bonding or soldering layer 118 can comprise Ni, Au, or any other suitable material. The eutectic bonding or soldering layer 118 can include multiple layers, e.g., a Ni layer with about 3.81 μm thickness and an Au layer with about 0.0508 μm thickness can be used together. In other embodiments, direct bonding or other bonding techniques can be used. There are many bonding processes and specifications, which are known in the art that may be used to bond the middle layer 114 and the other copper clad layer 120.

The copper clad layer 120 can comprise Cu with a thickness of about 35 μm-about 200 μm. An electrically isolating layer 122 can be a thermally conductive dielectric layer (e.g., with a thermal conductivity of about 0.5 W/mK-8 W/mK) or an epoxy with low thermal conductivity, with a thickness of about 35 μm-about 200 μm. Another via (or through hole) 124 can include Cu, Au, Ag, or any other suitable material (filled) to transfer heat. A metal core layer 126 can comprise Cu, Al, or any other suitable material with a thickness of about 0.8 mm-about 5 mm.

The copper clad layer 120, the electrically isolating layer 122, and the metal core layer 126 are parts of a metal core PCB (MCPCB) 119 in this example. The via 124 is used for thermal conduction through the MCPCB 119. The MCPCB 119 could sustain high breakdown voltage. In various embodiments, different PCBs, e.g., a PCB including FR-4, an Al-based MCPCB, or Cu-based MCPCB, or any other kinds of PCB can be used. The PCB allows easier installation of the LED module.

In embodiments using a direct-type MCPCB, the PCB may not have a dielectric layer for the electrically isolating layer 122, and only have the copper clad layer 120 and the metal core layer 126 (e.g., based on Al). The direct-type MCPCB can facilitate faster heat transfer. By using the PCB 119 as a bottom part of the LED carrier, the size of the middle layer 114 could be made smaller to fit the dimension of the LED die 102 to reduce cost, instead of using the same material of the middle layer 114 for the whole LED carrier.

A heat sink layer 128 can comprise Al, Cu, Ag, Fe, any combination thereof, or any other suitable material. The dimension of the heat sink layer 128 depends on specifications (e.g., how much power or heat, temperature requirements, etc.). For example, a 10 W LED source may need 10000 mm² of heat spreading square measure.

Figure 2:
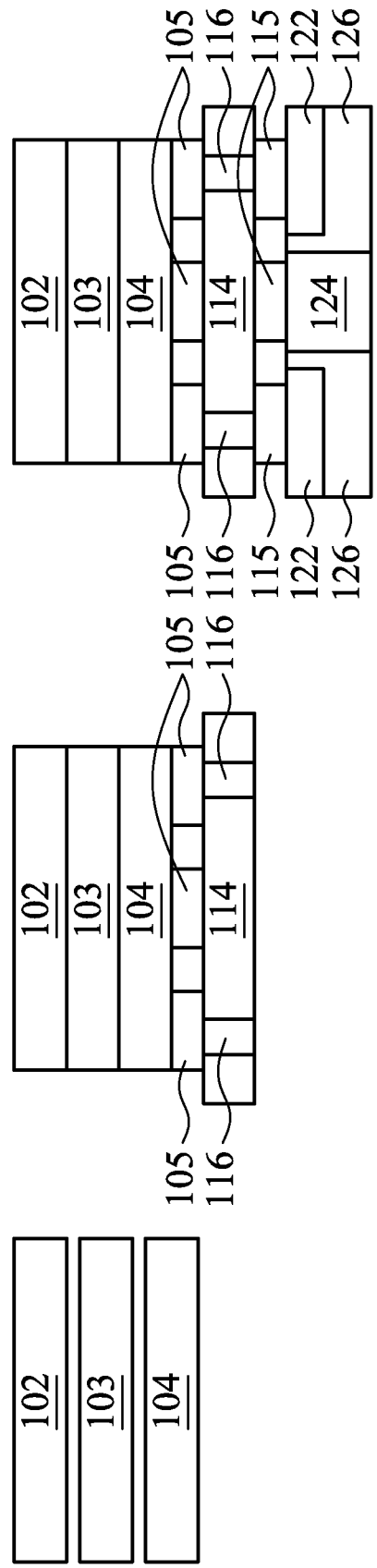
FIG. 2A-FIG. 2C are schematic diagrams showing exemplary steps of fabricating an exemplary light emitting diode (LED) carrier assembly such as shown in FIG. 1 according to some embodiments.

FIG. 2A-FIG. 2C are schematic diagrams showing exemplary steps of fabricating an exemplary light emitting diode (LED) carrier assembly such as shown in FIG. 1 according to some embodiments. In FIG. 2A, the LED die 102 is bonded to the silicon submount 104 using a bonding layer 103, including a thermal and electrical pad bonding.

In FIG. 2B, the silicon submount 104 is bonded to the middle layer 114 (and vias 116) using a bonding layer 105, including a thermal and electrical pad bonding. The bonding layer 105 corresponds to the eutectic bonding or a soldering layer 106, the thermal pad 108 and electrical pads 110, and the copper clad layer 112 in FIG. 1.

In FIG. 2C, the middle layer 114 (and vias 116) are bonded to a PCB including the electrically isolating layer 122, the via 124, and the metal core layer 126, using a bonding layer 115 (including a thermal and electrical pad bonding). The bonding layer 115 corresponds to the eutectic bonding or a soldering layer 118, and the copper clad layer 120 in FIG. 1.

Figure 3:
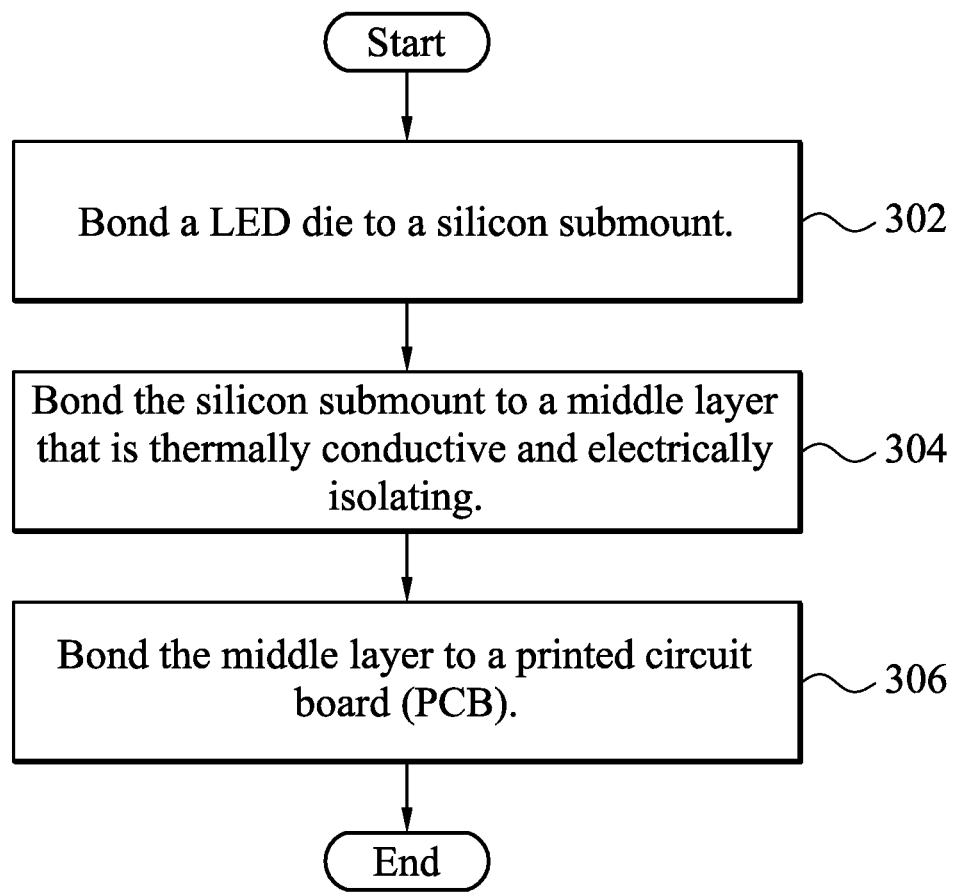
FIG. 3 is a flowchart for a method of fabricating an exemplary light emitting diode (LED) carrier assembly such as shown in FIG. 1 according to some embodiments.

FIG. 3 is a flowchart for a method of fabricating an exemplary light emitting diode (LED) carrier assembly such as shown in FIG. 1 according to some embodiments. At step 302, an LED die is bonded to a silicon submount. A eutectic bonding, a direct bonding, or other bonding techniques can be used. There are many bonding processes and specifications, which are known in the art, and are applicable to step 302. At step 304, the silicon submount is bonded to a middle layer that is thermally conductive and electrically isolating. At step 306, the middle layer is bonded to a printed circuit board (PCB).

In various embodiments, the PCB is bonded to a heat sink layer. At least one via (or through hole, e.g., filled with Cu) through the PCB is connected to the heat sink layer. The heat sink layer comprises Al, Cu, Ag, Fe, or any combination thereof. At least one via (or through hole, e.g., filled with Cu) is formed through the middle layer, which is connected to the PCB. A copper clad layer is formed above the middle layer. A thermal pad or an electrical pad is formed above the copper clad layer. The at least one via through the middle layer is connected to the copper clad layer.

According to some embodiments, a light emitting diode (LED) carrier assembly includes an LED die mounted on a silicon submount, a middle layer that is thermally conductive and electrically isolating disposed below the silicon submount, and a printed circuit board (PCB) disposed below the middle layer. The middle layer is bonded with the silicon submount and the PCB.

According to some embodiments, a method of fabricating a light emitting diode (LED) carrier assembly includes bonding an LED die to a silicon submount. The silicon submount is bonded to a middle layer that is thermally conductive and electrically isolating. The middle layer is bonded to a printed circuit board (PCB).

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A light emitting diode (LED) carrier assembly, comprising:
    an LED die mounted on a silicon submount;
    a middle layer disposed below the silicon submount, the middle layer consisting of a material that has both thermally conductive and electrically isolating properties; a metal clad layer disposed between the silicon submount and the middle layer
    a thermal pad and two electrical pads disposed between the silicon submount and the metal clad layer, wherein an entirety of the thermal pad is disposed between the two electrical pads;
    at least one via extending through the middle layer, the via containing Cu, Au, or Ag, wherein the at least one via is electrically coupled to at least one of the two electrical pads; and
    a printed circuit board (PCB) disposed below the middle layer,
    wherein the middle layer is bonded with the silicon submount and the PCB.

2. The LED carrier assembly of claim 1, further comprising a heat sink layer disposed below the PCB.

3. The LED carrier assembly of claim 2, wherein at least one further via through the PCB connects to the heat sink layer.

4. The LED carrier assembly of claim 2, wherein the heat sink layer comprises Al, Cu, Ag, Fe, or any combination thereof.

5. The LED carrier assembly of claim 1, wherein the at least one via disposed within the middle layer connects the PCB and the metal clad layer.

6. The LED carrier assembly of claim 1, wherein the middle layer is bonded with the silicon submount and the PCB using a eutectic bonding or a soldering layer.

7. The LED carrier assembly of claim 1, wherein the middle layer consists of AlN, $Al_2O_3$, diamond or any combination thereof.

8. The LED carrier assembly of claim 1, wherein the PCB comprises Fr-4, AlObased metal core PCB (MCPCB), or Cu-based MCPCB.

9. A method of fabricating a light emitting diode (LED) carrier assembly, comprising:
    bonding an LED die to a silicon submount without using bump electrodes; forming a metal clad layer above a middle layer, wherein the middle layer consists of a materials that is both thermally conductive and electrically isolating;
    bonding, at least in part through a thermal pad and two electrical pads, the silicon submount to the middle layer, wherein the thermal pad is disposed between the two electrical pads in its entirety, and wherein the two electrical pads are electrically coupled respectively to a first via and a second via that each extend through the middle layer and wherein the bonding is performed such that the thermal pad and the two electrical pads are disposed between the metal clad layer and the silicon submount; and bonding the middle layer to a printed circuit board (PCB).

10. The method of claim 9, further comprising bonding the PCB to a heat sink layer.

11. The method of claim 10, wherein bonding the PCB to the heat sink layer includes connecting at least one of the first and second vias through the PCB to the heat sink layer.

12. The method of claim 10, wherein the heat sink layer comprises Al, Cu, Ag, Fe, or any combination thereof.

13. The method of claim 9, further comprising forming at least one of the first and second vias through the middle layer.

14. The method of claim 13, wherein bonding the silicon submount to the middle layer includes connecting the at least one of the first and second vias through the middle layer to the PCB.

15. The method of claim 9, wherein bonding the silicon submount to the middle layer further includes connecting at least one of the first and second vias through the middle layer to the metal clad layer.

16. A light emitting diode (LED) carrier assembly, comprising:

an LED die mounted on a silicon submount;

two electrical pads and a thermal pad each disposed below the LED die, wherein the two electrical pads are electrically coupled to the LED die, the thermal pad is thermally coupled to the LED die, and an entirety of the thermal pad is disposed between the two electrical pads;

a middle layer that consists of a thermally conductive and electrically isolating material disposed below the two electrical pads and the thermal pad a metal clad layer disposed between the silicon submount and the middle layer, wherein the thermal pad and two electrical pads disposed between the silicon submount and the metal clad layer;

a printed circuit board (PCB) disposed below the middle layer; and a heat sink layer disposed below the PCB, wherein the middle layer is bonded with the silicon submount and the PCB, at least one first via through the PCB connects to the heat sink layer, and at least one second via through the middle layer connects to the PCB, and wherein the first via is electrically coupled to a first one of the two electrical pads, and wherein the second via is electrically coupled to a second one of the two electrical pads.

* * * * *